United States Patent [19]
Ichiyoshi

[11] Patent Number: 5,351,014
[45] Date of Patent: Sep. 27, 1994

[54] VOLTAGE CONTROL OSCILLATOR WHICH SUPPRESSES PHASE NOISE CAUSED BY INTERNAL NOISE OF THE OSCILLATOR

[75] Inventor: Osamu Ichiyoshi, Tokyo, Japan

[73] Assignee: NEC Corporation, Japan

[21] Appl. No.: 101,386

[22] Filed: Aug. 2, 1993

[30] Foreign Application Priority Data

Aug. 5, 1992 [JP] Japan .................................. 208651

[51] Int. Cl.⁵ .................... H03L 7/085; H03L 7/16
[52] U.S. Cl. .................... 331/1 A; 331/14; 331/16; 331/17; 331/18; 331/25
[58] Field of Search .................... 331/1 A, 14, 16, 17, 331/18, 25

[56] References Cited

U.S. PATENT DOCUMENTS

| | | | |
|---|---|---|---|
| 3,555,446 | 1/1971 | Braymer | 331/16 |
| 3,582,810 | 6/1971 | Gillette | 331/16 X |
| 4,706,040 | 11/1987 | Mehrgardt | 331/16 X |
| 4,951,004 | 8/1990 | Sheffer et al. | 331/1 A |

Primary Examiner—David Mis
Attorney, Agent, or Firm—Osterlenk, Faber, Gerb & Soffen

[57] ABSTRACT

A frequency synthesizer is composed of a reference oscillator, the first and the second integrators, a binary adder, a low pass filter and VCO forming a Phase Locked Loop (PLL). The first integrator, driven by the timing of a reference oscillator, integrates an externally supplied value K and generates the input signal. The second integrator, driven by the output signal of the VCO of the PLL, integrates an externally supplied value L. The binary adder detects the difference between the outputs of the first and the second integrators functioning as a phase comparator. The output of the phase comparator is converted into an analog voltage which is filtered to control the VCO to achieve frequency synthesis by the phase lock function of the loop.

3 Claims, 5 Drawing Sheets

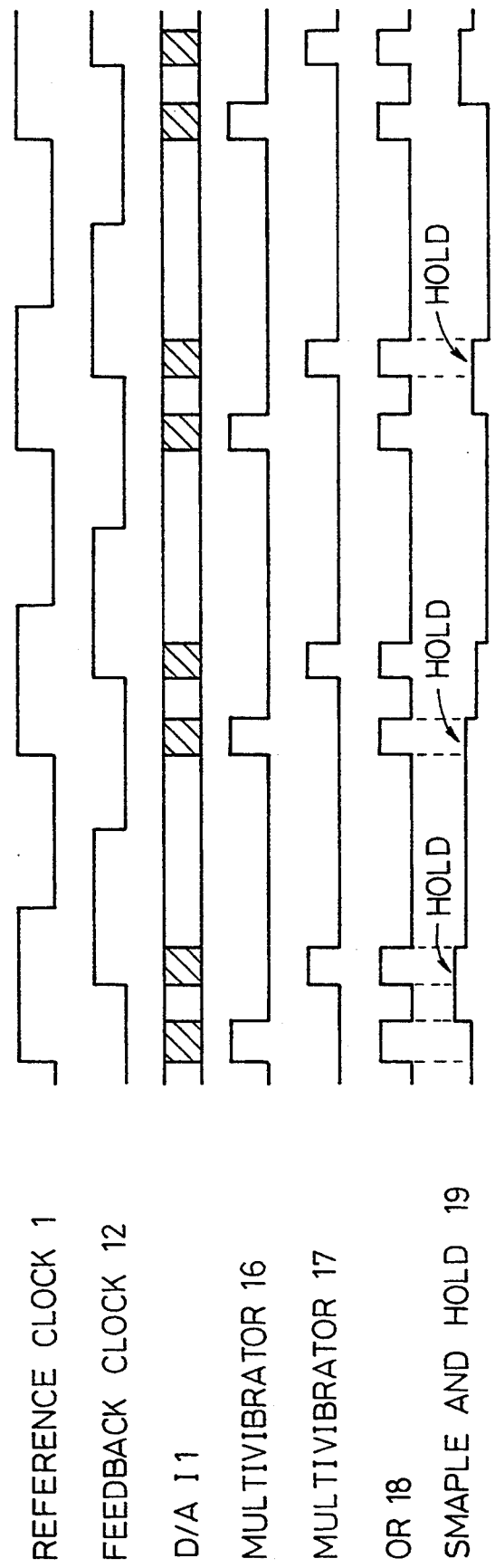

VOLTAGE CONTROL OSCILLATOR WHICH SUPPRESSES PHASE NOISE CAUSED BY INTERNAL NOISE OF THE OSCILLATOR

BACKGROUND OF THE INVENTION

The present invention relates to a frequency synthesizer that generates a desired frequency according to an externally originated designation. Frequency synthesizers are a basic technology used in a wide range of industrial fields including communications, broadcasting, and measurement.

DESCRIPTION OF THE BACKGROUND ART

As shown in FIG. 1, a conventional frequency synthesizer is made up of a reference oscillator 1, a frequency divider 2, a phase detector 3, a low-pass filter 4, a voltage-controlled oscillator (VCO) 5, and a variable frequency divider 6. Let the generated frequency of the reference oscillator 1 be $f_R$, the frequency divide ratio of the frequency divider 2 be m, the output frequency of the VCO 5 be $f_v$, the frequency divide ratio of the variable frequency divider 6 designated from the outside be N. Then the output frequency of the frequency divider 2 $\Delta f$ is represented by formula (1):

$$\Delta = f_R/m \tag{1}$$

The loop made up of the phase detector 3, low-pass filter 4, VCO 5, and variable frequency divider 6 constitutes a phase-locked loop (PLL), and in a synchronous state, the frequencies of the two inputs of the phase detector 3 become absolutely equal and the relation of formula (2) is achieved.

$$f_v = N^* \Delta f \tag{2}$$

Since N is variable, the output signal of frequency fv can be generated as a multiple of $\Delta f$, hence in variable units of $\Delta f$.

However, frequency synthesizers of the prior art have the following drawbacks: The operation of the variable frequency divider 6 unavoidably generates a time delay for the counting processing, the magnitude of this time delay being nearly on the order of $1/\Delta f$. This means that the smaller the frequency step $\Delta f$, the greater the delay generated within the loop. In order to maintain stability in the control loop having the feedback path with the delay, the loop response time must be made sufficiently larger than the amount of this delay. However, such a construction reduces the phase tracking property of the PLL and the phaselock performance of the VCO with the reference oscillator 1 becoming weak and the internal noise within the VCO 5 not being reduced by the phase locking. Thus the output contains much of the VCO internal noise. Generally, the higher the output frequency, the greater the noise within the VCO, thereby worsening the above-described drawback.

SUMMARY OF THE INVENTION

The purpose of the present invention is to provide a frequency synthesizer that achieves a fine frequency step and simultaneously a small output phase noise.

The frequency synthesizer of the present invention comprises a Q-bit binary integration circuit that, driven by the highly stable timing of a reference oscillator, integrates a numerical value K that is provided from the outside as a Q (a natural number) bit binary code, a voltage-controlled oscillator (VCO) that is to generate the output signal of the desired frequency, a frequency divider that frequency divides the output of the VCO and generates a feedback timing signal, a P (natural number)-bit binary integration circuit that integrates a designated binary coded numerical value L driven by the timing of the output of the frequency divider, an R-bit binary adder that is supplied with each of the most significant R bits of the Q-bit and P-bit binary integration circuits and calculates the difference between them, a digital/analog (D/A) converter that converts the output of the R-bit binary adder to an analog voltage and a low-pass filter that smooths the output of the D/A converter. The frequency synthesizer of the present invention controls the phase of the VCO by the output of the low-pass filter and achieves generation of the output signal frequency controlled according to a numerical value K provided from the outside.

As described above, by replacing frequency divider 2, programmable divider 6 and phase detector 3 of the conventional frequency synthesizer with a Q-bit and a P-bit binary integration circuit and an R-bit binary adder implemented in digital circuits, the present invention can produce the following effects:
a) By setting a large value for Q for the Q-bit integration circuit, the output frequency can be generated in steps of a desired fine precision, as the frequency step is inversely proportional to 2.
b) By increasing the PLL bandwidth without loop instability problem phase noise originating within the VCO interior noise can be suppressed.
c) By making the binary bit number R of the digital processing circuit of the PLL large, the quantizing noise can be suppressed.
d) The analog circuits of the prior art can be mostly replaced with digital circuits, enabling both accurate operation and an apparatus of reduced size by application of large scale integration (LSI).

The above and other objects, features, and advantages of the present invention will become apparent from the following description referring to the accompanying drawings which illustrate an example of preferred embodiments of the present invention.

BRIEF DESCRIPTION OF THE DRAWINGS

FIG. 5 is a timing chart of the signals of each part of the second embodiment.

DETAILED DESCRIPTION OF THE PREFERRED EMBODIMENTS

Figure 1:
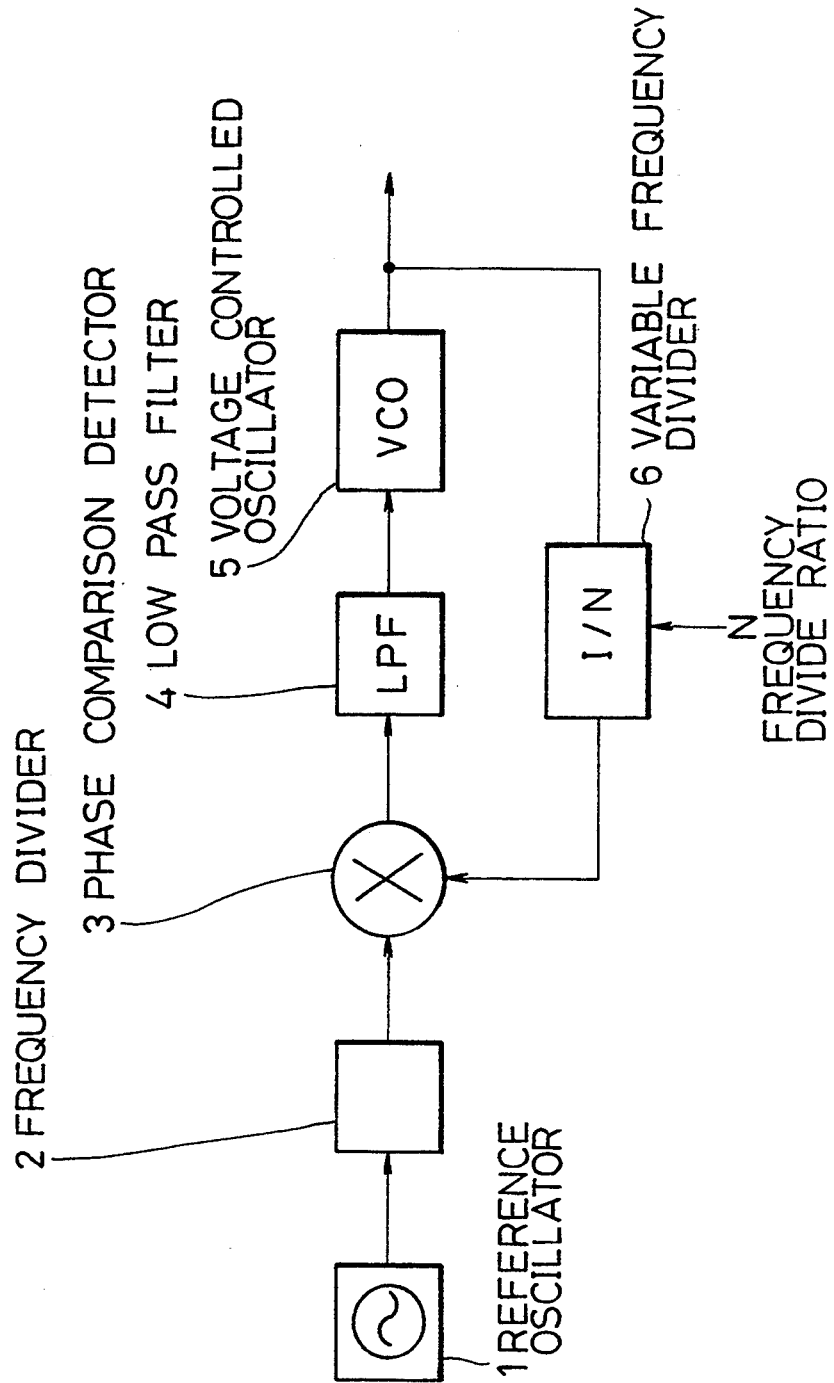
FIG. 1 is a block diagram of a conventional frequency synthesizer.
Figure 2:
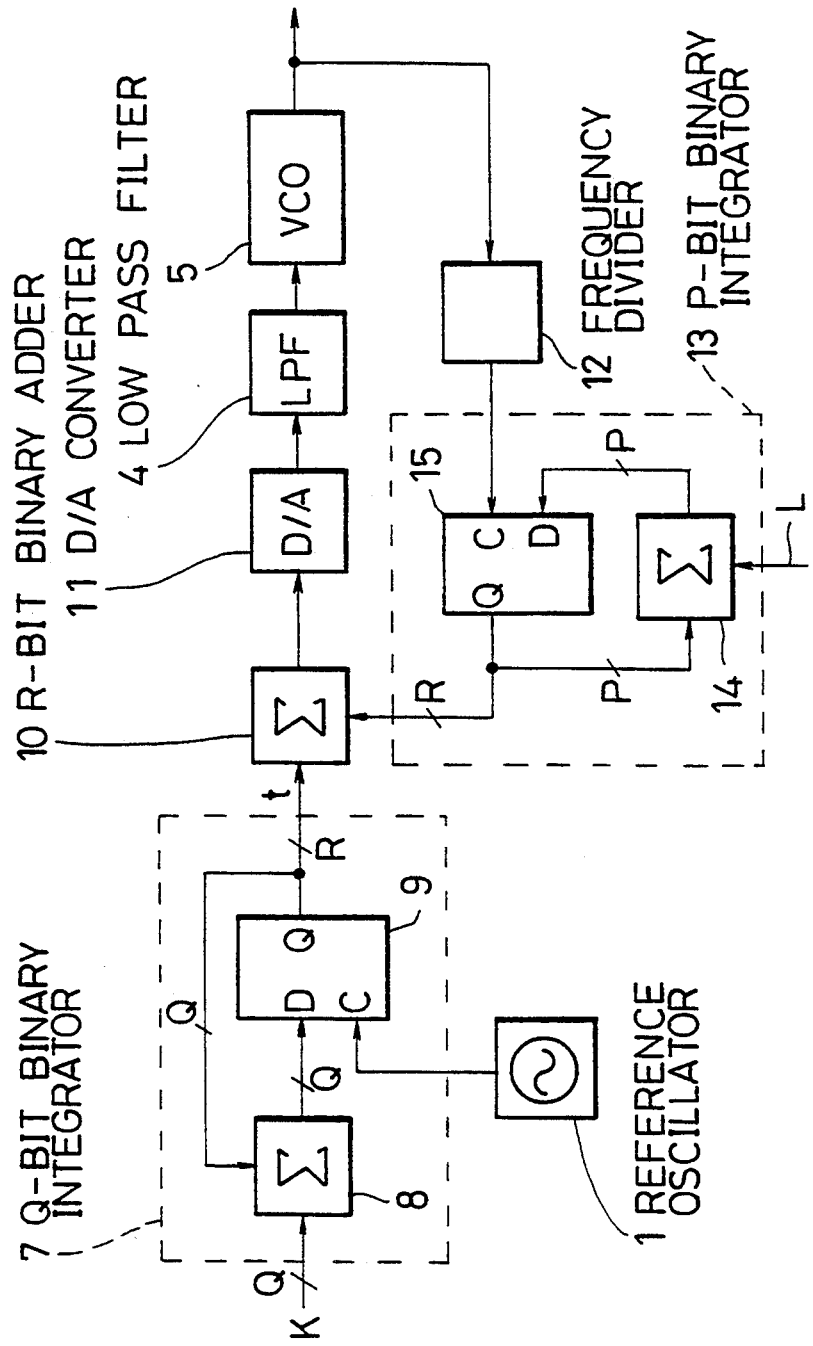
FIG. 2 is a block diagram of the first embodiment of the present invention.

As shown in FIG. 2, the frequency synthesizer of the present embodiment, similar to a frequency synthesizer of the prior art, includes a reference oscillator 1, a loop filter 4, and a VCO 5, and in addition includes Q-bit binary integration circuit 7, a frequency divider 12 of fixed divided frequency ratio, a P-bit binary integration circuit 13, an R-bit binary adder 10, and a D/A converter 11. Of these, the Q-bit binary integration circuit 7 is composed of a Q-bit binary adder 8 and a Q-bit latch 9 whose outputs are fed back to adder 8 and the R most of significant bits of the Q-bit latch 9 are also given as the output of the integrator, while the P-bit binary integration circuit 13 is made up of a P-bit binary adder 14 and a P-bit latch 15 whose outputs are fed back to adder 14 and at the same time the R most significant bit of the P-bit latch 15 is given as the output of the interpreter.

Figure 3:
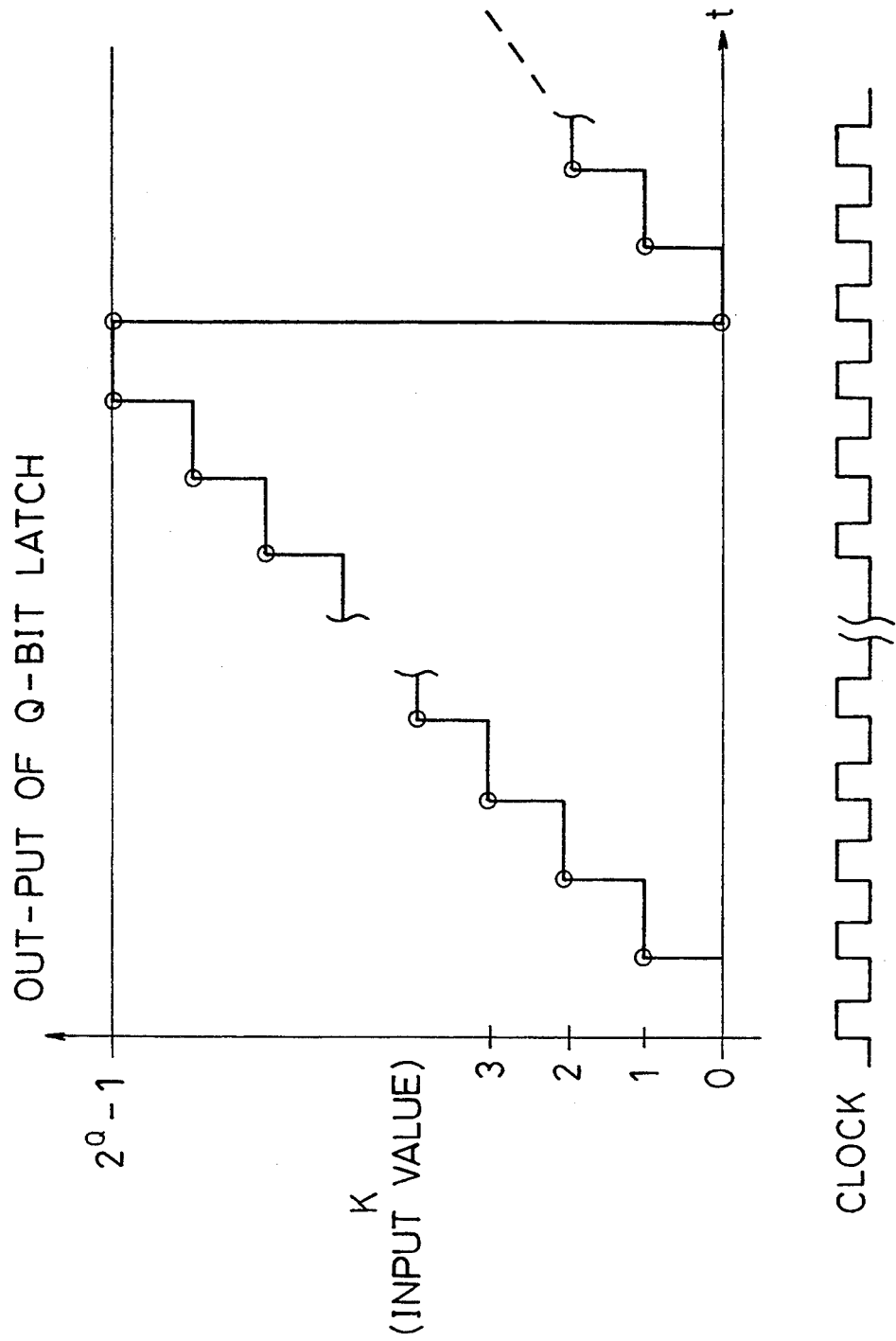
FIG. 3 is an operational diagram of the Q-bit binary integration circuit of the first embodiment.

The operation of the present embodiment will next be explained with reference to FIGS. 2 and 3.

In the Q-bit binary integration circuit 7, value K inputted as a Q-bit binary code from the outside is added by the binary adder 8 to the output of latch 9 and the adder output is then latched by the timing of the reference oscillator 1. The output of the Q-bit latch 9 increases by K in each of the above additions. When this output value exceeds $2^Q-1$, it then becomes 0 in the case of $K=1$, and the operation continues in a sawtooth pattern with a period of 2 to the Q-th power. In other words, the repeated frequency becomes $f_R/2^Q$ (Hz). In general, for the given value K, it is apparent the above-described change is merely multiplied by K.

The output frequency $F_7$ of the Q-bit binary integration circuit 7 in general can then be represented by formula (3).

$$f_7 = K * f_R/2^Q \tag{3}$$

In the same way, the output frequency $f_{13}$ of the P-bit binary integration circuit 13 varies according to the value L applied as a P-bit binary code from the outside can be represented by formula (4).

$$f_{13} = L * \tfrac{1}{2}^P * (f_v/M) \tag{4}$$

Here, M is the frequency divide ratio of the frequency divider 12.

The outputs of the above two integration circuits expresses the timing phase of the reference and feedback signals. Therefore the difference between them can be interpreted as a phase difference between the two signals. The most significant R bits of both integrators 7, 13 are put into the R-bit binary adder 10 to calculate the difference between the two. The output of the R-bit binary adder 10 is converted to an analog voltage by the D/A converter 11. Then the following processing is carried out in the same manner as in a conventional phase-locked loop.

In a synchronous state, $f_7 = F_{13}$ and formula (5) leads to formula (6).

$$K * f_R/2^Q = L * \tfrac{1}{2}^P * f_v/M \tag{5}$$

Hence $$f_v = \frac{M/2^Q}{L/2^P} * f_R * K = K * \delta f \tag{6}$$

Where $$\delta f = \frac{M/2^Q}{L/2^P} * f_R \tag{7}$$

thus generation of a frequency signal in the step of $\delta f$ (7) is enabled.

This characteristic means that frequency steps of a desired fineness can be easily realized by making Q sufficiently larger. In the present embodiment, the delay within the phase lock loop arises only at the frequency divider 12 which is on the order of a period of its output pulse, much shorter then that of the integrator 13 output. Because the delay within the loop is small, the loop can be made sufficiently broadband, and the internal noise of the VCO can be suppressed by the phase lock with the stable reference signal. In addition, the quantization noise due to digitalization can be suppressed if the number of bits R of the numerical value applied to the D/A converter is made duly large.

Figure 4:
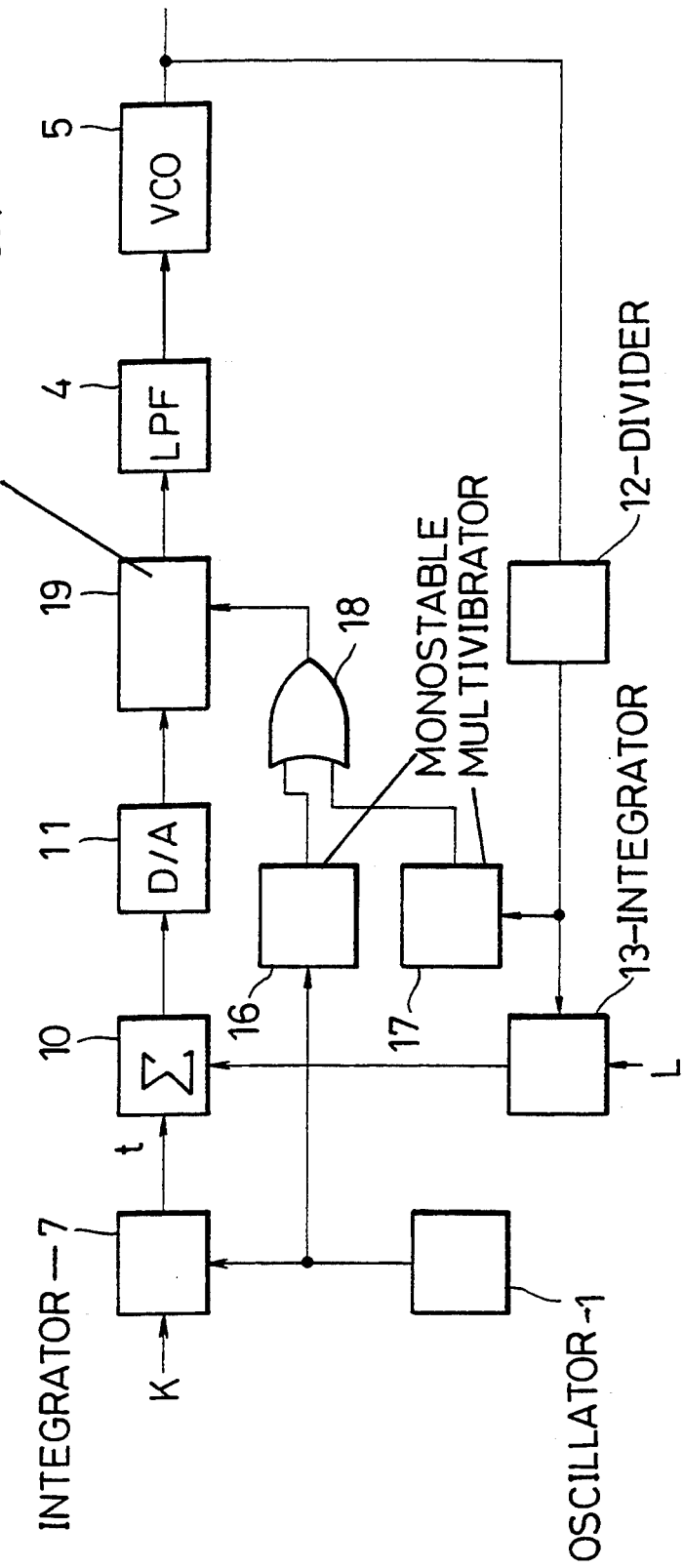
FIG. 4 is a block diagram of the second embodiment.

A second embodiment will next be explained wither reference to FIGS. 4 and 5.

In this embodiment, the first embodiment is further supplemented with two monostable multivibrators 16, 17, an OR logic device 18, and a sample and hold circuit 19.

The Q-bit binary integration circuit 7 and the P-bit binary integration circuit 13 naturally operate at asynchronous timings. In addition, the [R-bit binary] adder 10 and the D/A converter 11 require a certain amount of processing time following changes in input before their outputs stabilize, meaning that the output during this time is unstable noise. The second embodiment is intended to eliminate this unstable noise. The times of unstable noise from the reference clock, and the feedback frequency divider clock, which are the driving timing for the R-bit binary adder and the D/A converter, are detected by means of the monostable multivibrators 16, 17 and the OR logic device 18, and while the output of the D/A converter are detected by means of the monostable multivibrators 16, 17 and the OR logic device 18, and while the output of the D/A converter becomes unstable, the sample and hold circuit 19 is controlled by the output of the OR logic device 18 to maintain the preceding value. Since the timing in the reference clock or the feedback frequency divider clock are not identical, pairs of unstable portions appear in the output of the D/A converter as shown in the diagonally shaded portions of FIG. 5. This unstable output is detected by the two monostable multivibrators 16 and 17 and pulses corresponding to each are outputted to the sample and hold circuit 19. By means of these pulses, the sample and hold circuit 19 maintains the preceding level, as shown in the lowermost stage of the figure, and inhibits application of the noise from the D/A converter to the low pass filter.

It is understood that variations and modifications of the embodiments disclosed herein will be evident to those skilled in the art. It is intended that all such modifications and variations be included within the scope of the appended claims.

What is claimed is:

1. A frequency synthesizer in which a generated frequency signal is controlled by an externally provided numerical figure, comprising:
a Q-bit binary numerical integration circuit that integrates a given numerical value K provided from the outside in the form of a Q-bit binary coded number by a Q-bit binary adder and a latch driven by the timing of a highly stable reference oscillator;
a voltage-controlled oscillator (VCO) that generates an output signal with a frequency controlled by an applied control voltage as a reference frequency,
a frequency divider that divides the frequency of the output of said VCO to generate a pulse signal output at a frequency proper for subsequent processings;

a P-bit binary integration circuit that integrates a fixed numerical value L driven by the timing of the pulse signal output of said frequency divider;

an R-bit binary adder that inputs the most significant R bits of said Q-bit binary integration circuit and of said P-bit binary integration circuit and outputs the difference therebetween;

a D/A converter that converts a digital coded value of an output of said R-bit binary adder into an analog output voltage; and a low pass filter that smooths the analog output voltage of said D/A converter and provides the control voltage to the VCO.

2. The frequency synthesizer of claim 1, further including a first monostable multivibrator that generates a binary logic output driven by the reference frequency, a second monostable multivibrator that generates a binary logic output driven by the pulse signal output of the frequency divider, an OR logic device that generates a logical OR sum of output signals of said first and second monostable multivibrators, and a sample and hold circuit inserted between the D/A converter and the low pass filter that performs a track and hold function controlled by the output of the OR logic device, to inhibit noise that exists at the output of the D/A converter for a short period after each cycle of the VCO and the frequency divider.

3. The frequency synthesizer of claim 2, including means for connecting the D/A converter and the low pass filter while in a track state and for disconnecting the same while in a hold mode and for maintaining a previous voltage as an input to the low pass filter in the hold mode.

* * * * *